United States Patent [19]

Yamaoka et al.

[11] Patent Number: 5,596,217

[45] Date of Patent: Jan. 21, 1997

[54] SEMICONDUCTOR DEVICE INCLUDING OVERVOLTAGE PROTECTION DIODE

[75] Inventors: Masami Yamaoka, Anjo; Shoji Toyoshima, Konan, both of Japan

[73] Assignee: Nippondenso Co., Ltd., Aichi-pref., Japan

[21] Appl. No.: 407,157

[22] Filed: Sep. 14, 1989

Related U.S. Application Data

[63] Continuation of Ser. No. 148,085, Jan. 25, 1988, abandoned, which is a continuation of Ser. No. 859,215, May 2, 1986, abandoned, which is a continuation of Ser. No. 452,404, Dec. 22, 1982, abandoned.

[30] Foreign Application Priority Data

Dec. 24, 1981 [JP] Japan .................................. 56-215649
Feb. 5, 1982 [JP] Japan .................................. 57-17085

[51] Int. Cl.$^6$ ........................................... H01L 29/866
[52] U.S. Cl. .......................................... 257/367; 257/488
[58] Field of Search ................................. 257/367, 488

[56] References Cited

U.S. PATENT DOCUMENTS 3,648,340 3/1972 MacIver ...................................... 357/14

FOREIGN PATENT DOCUMENTS

| 51-22379 | 2/1976 | Japan . |
| 55-56656 | 4/1980 | Japan . |
| 55-80352 | 6/1980 | Japan . |
| 55-125678 | 9/1980 | Japan . |

Primary Examiner—William D. Larkins
Attorney, Agent, or Firm—Cushman, Darby & Cushman

[57] ABSTRACT

A semiconductor device includes a diode element for protecting a transistor against an overvoltage. A first region of p-type conductivity is formed on an upper surface of an n-type semiconductor substrate in which base and emitter regions of the transistor are formed. A second region of $n^+$-type conductivity whose impurity concentration is higher than that of the n-type semiconductor substrate is formed on its upper surface to be spaced apart from the first region. An insulating film is formed to cover the upper surface of the semiconductor substrate. Furthermore, a conductive film is formed to partially overlap the first and second regions through the insulating film. The first region serves as an anode, the second region serves as a cathode, and the conductive film serves as a gate electrode; thus an overvoltage protection diode is obtained.

34 Claims, 5 Drawing Sheets

5,596,217

SEMICONDUCTOR DEVICE INCLUDING OVERVOLTAGE PROTECTION DIODE

This is a continuation of application Ser. No. 07/148,085, filed Jan. 25, 1998, now abandoned which is a continuation of Ser. No. 06/859,215, filed 5/2/86, now abandoned; which is a Rule 62 FWC of Ser. No. 06/452,404 filed 12/22/82, now abandoned.

BACKGROUND OF THE INVENTION

The present invention relates to a semiconductor device having a circuit which includes at least one transistor and, more particularly, to a semiconductor device having a transistor circuit of a high withstand voltage which includes an overvoltage protection diode with a controlled breakdown voltage.

In a high power transistor circuit, a combination of overvoltage protection diodes are used to protect the transistor elements. These protection diodes must be connected to the collector-base paths of the transistors on one chip. Furthermore, a breakdown voltage $V_Z$ of the protection diode must be lower than a DC collector-to-emitter voltage (base open) $V_{CEO}$.

Such a protection diode is connected to the collector-base path of the transistor on one chip in the following manner. An impurity is deeply diffused from part of an inactive base region to a collector region of a high concentration, thereby determining the breakdown voltage $V_Z$. Alternatively, an impurity is ion-implanted in part of the inactive base region to form a high-impurity region of the same conductivity type as that of the collector region, thus determining the breakdown voltage $V_Z$.

However, the protection diode of the type described above must be formed in a separate process from a process for forming a general transistor. Furthermore, in the case of an ignitor output circuit for an ignition control circuit of an internal combustion engine, the breakdown voltage of the protection diode must fall within a range of 360 V ±10%. it is very difficult to set the breakdown voltage in the above range.

SUMMARY OF THE INVENTION

It is a primary object of the present invention to provide a semiconductor device having an overvoltage protection diode which can be formed during the same process as used for manufacturing a transistor and which has stable electric characteristics, in particular, a controllable breakdown voltage.

It is another object of the present invention to provide a semiconductor device wherein an overvoltage protection diode is formed on one major surface of a semiconductor substrate, and a breakdown voltage $V_Z$ of the protection diode may not vary even if the diode is influenced by an external electric charge.

It is still another object of the present invention to provide a semiconductor device of a high withstand voltage on one chip for an ignitor output circuit of an internal combustion engine wherein a protection diode is connected between collector and base of a transistor of a Darlington circuit, without increasing the area of the chip.

The overvoltage protection diode built into the semiconductor device according to the present invention has a first region spaced apart from a second region in one major surface of the semiconductor substrate. The first region has a conductivity type opposite to that of the semiconductor substrate. The second region has the same conductivity as that of the semiconductor substrate and an impurity concentration higher than that of the substrate. Furthermore, a protection insulating film is formed to cover the entire surface including the first and second regions. A conductive film is then deposited on a portion of the protection insulating film so as to partially overlap the first and second regions. This conductive film then serves as a gate electrode.

DETAILED DESCRIPTION OF THE PREFERRED EMBODIMENTS

Figure 1:
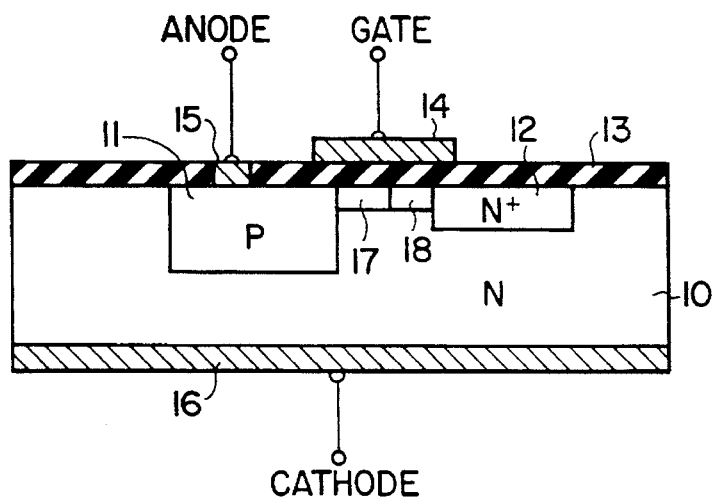
FIG. 1 is a sectional view of a semiconductor device and, especially, of an overvoltage protection diode thereof according to an embodiment of the present invention.

FIG. 1 shows an overvoltage protection diode formed in a semiconductor device. The semiconductor device has an n-type semiconductor substrate 10. A first region 11 which serves as a p-type anode region is formed on one major surface of the semiconductor substrate 10. A second region which serves as a cathode region is also formed on the one major surface of the semiconductor substrate 10, spaced apart from the first region 11. The second region 12 has an it purity concentration higher than that of the first region 11 or an $n^+$-type conductivity. An insulating film 13 such as a silicon oxide film is formed to cover the entire surface. A conductive film 14 is selectively formed on the insulating film 13. The conductive film 14 partially overlaps both first and second regions 11 and 12 through the insulating film 13, and is thus simultaneously surrounded by the first and second regions 11 and 12.

The first region 11 functions as an anode electrode 15 and is connected as an anode to a lead wire. Similarly, the conductive film 14 functions as a gate electrode and is connected as a gate to a lead wire. A conductive film 16 is then deposited on the other major surface of the semiconductor substrate 10 and is connected as a cathode to a lead wire.

Figure 2:
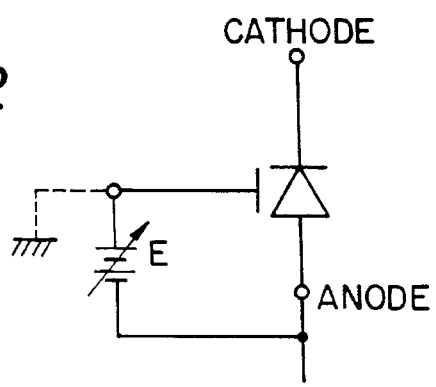
FIG. 2 is a circuit diagram showing an equivalent circuit of the protection diode shown in FIG. 1.

In the protection diode of the type described above, a power source E is connected between the gate and the anode, as shown in FIG. 2. A reverse-bias voltage is then applied to the anode In this case, a gate voltage $V_G$ is set at 0 V. When a reverse-bias voltage is increased in this condition, an inverted layer 17 is formed in a surface layer of the semiconductor substrate 10 beneath the conductive film 14 as the gate electrode. The inverted layer 17 extends between the first region 11 and the second region 12. A potential difference between the gate and the semiconductor substrate 10 in this state is defined as $V_T$.

When the reverse-bias voltage is further increased, the majority carriers of the inverted layer 17 are expelled from the portion thereof which is adjacent to the second region 12. A depletion region 18 is thus formed between the inverted layer 17 and the second region 12. As a result, an avalanche breakdown effect occurs in proportion to the strength of the electric field determined by the impurity concentration of the semiconductor substrate 10. A breakdown voltage $V_Z$ is always lower than an inherent withstand voltage of the semiconductor substrate 10. According to an experiment by the present inventors, the breakdown voltage $V_Z$ is about one-third of the withstand voltage described above. Therefore, a transistor protection diode having the above-mentioned breakdown voltage can be suitably formed in a semiconductor device on a single chip.

In the protection diode of the type described above, controllability of the breakdown voltage $V_Z$ may seem to depend upon a distance between the first region 11 and the second region 12. However, the inverted layer 17 is formed between the first region 11 and the second region 12 and is kept at a constant voltage. Therefore, the distance between the first and second regions 11 and 12 bears no relationship to the breakdown voltage, and may be determined only so as to obtain a required dielectric resistance or withstand voltage.

In the protection diode having the above arrangement, the distance between the first and second regions 11 and 12 need not be precisely determined. As a result, the variation in the breakdown voltage $V_Z$ of this diode is about one-fifth of that of the conventional protection diode. This effect is called a buffer effect of the inverted layer.

The active surface portion of the diode is shielded by the conductive film 14 through the insulating film 13. For this reason, influence of the external electric charge on the diode can be properly eliminated. Therefore, fore, the breakdown voltage $V_Z$ becomes stable, without any change over time.

The semiconductor device shown in FIG. 1 will be described in more detail. The semiconductor substrate 10 has an n-type conductivity and an impurity concentration of $1.5\times10^{14}$ atoms/cm$^3$. The first region 11 comprises a p-type diffusion layer and has a surface concentration of $1\times10^{18}$ atoms/cm$^3$. The depth of the diffusion layer is 30 μm. The second region 12 comprises an n-type diffusion layer and has a surface concentration of $2\times10^{19}$ atoms/cm$^3$. The depth of the second region 12 is 18 μm. The insulating film 13 comprises a silicon oxide film (SiO$_2$) formed by phosphorus getter sputtering to a thickness of 4.0 μm. The conductive film 14 and the anode electrode 15 respectively comprise aluminum deposition films each having a thickness of 4.0 μm.

When the protection diode of the type described above is used for protecting an output transistor circuit such as an ignitor of an internal combustion engine, the first region 11 is formed simultaneously with the formation of the base of the transistor element, whereas the second region 12 is formed when the emitter of the transistor element is formed. The field oxide film may be used as the insulating film 13. The conductive films or electrodes can be formed at the same time as the base and emitter electrodes of the transistor element are formed. In other words, when the protection diode is formed together with the transistor on the single chip, special steps for forming the protection diode are not required.

In general, the gate is directly connected by aluminum wiring to the first region 11. Furthermore, an inactive portion of the base region of the transistor formed in the semiconductor substrate 10 may also be used as the first region 11.

A withstand voltage $V_{BULK}$ inherent in the semiconductor substrate is about 1,000 V. The collector-to-emitter voltage (base open) $V_{CEO}$ of the transistor having the base and emitter which are formed in the above-mentioned semiconductor substrate is about 400 V. The breakdown voltage $V_Z$ of the protection diode shown in FIG. 1 is found to be given by the following equation:

$$V_Z = V_T + (\tfrac{1}{3})V_{BULK}$$

When a surface charge density $Q_{SS}$ of the insulating film 13 is given as $2\times10^{11}$ atoms/cm$^3$, $V_T$ is given as about 50 V. Therefore, the breakdown voltage $V_Z$ turns out to be about 383 V.

This breakdown voltage satisfies a rated range of 330 $V<V_Z<V_{CEO}$ for a protection Zener diode used for the output transistor circuit of the conventional ignitor. Furthermore, a change in the breakdown voltage $V_Z$ falls within ±5% due to the buffer effect of the inverted layer 17, which is not dependent upon the distance between the diode and the cathode.

The stability of the breakdown voltage $V_Z$ over time is considered. The active portion is shielded by the conductive film 14 from the external electric charge. The mobile electric charge within the insulating film 13 comprises positive electric charge such as Na$^+$ ions when getter sputtering is performed. However, in the protection diode shown in the above embodiment, the semiconductor substrate 10 has an n-type conductivity and the gate and the anode are commonly used with the base of the transistor. Therefore, the gate is kept at a negative potential. The positive electric charge described above is thus attracted to the gate and does not influence the active portion of the diode in the semiconductor substrate 10; thus a stable breakdown voltage $V_Z$ is constantly obtained.

Figure 3A:
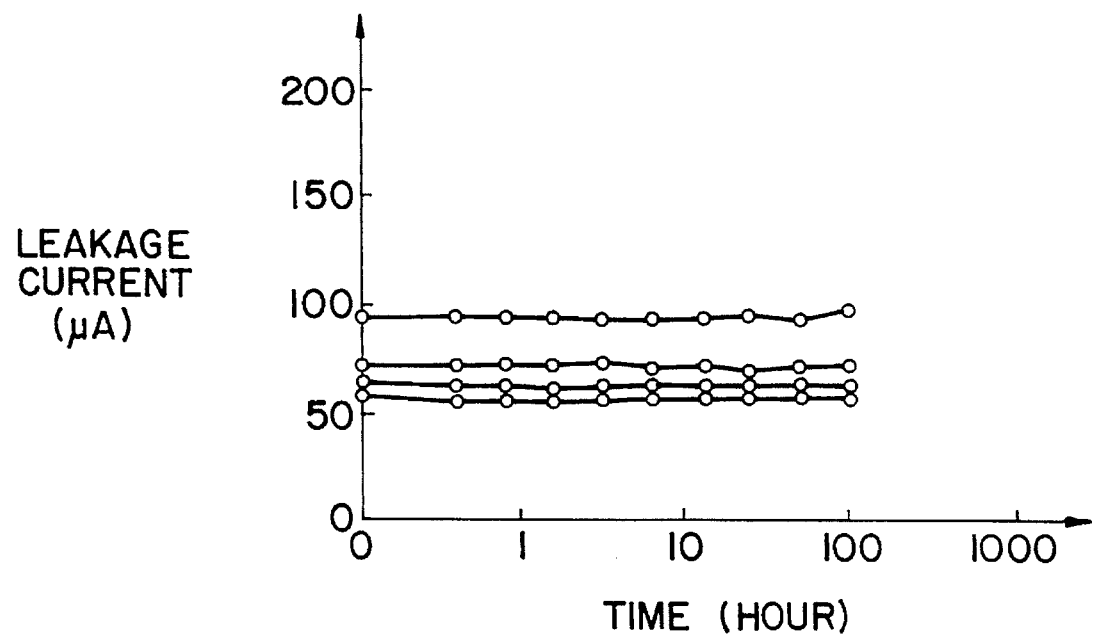
FIGS. 3A and 3B are graphs for respectively explaining the leakage current and the breakdown voltage of the protection diode as a function of time.
Figure 3B:
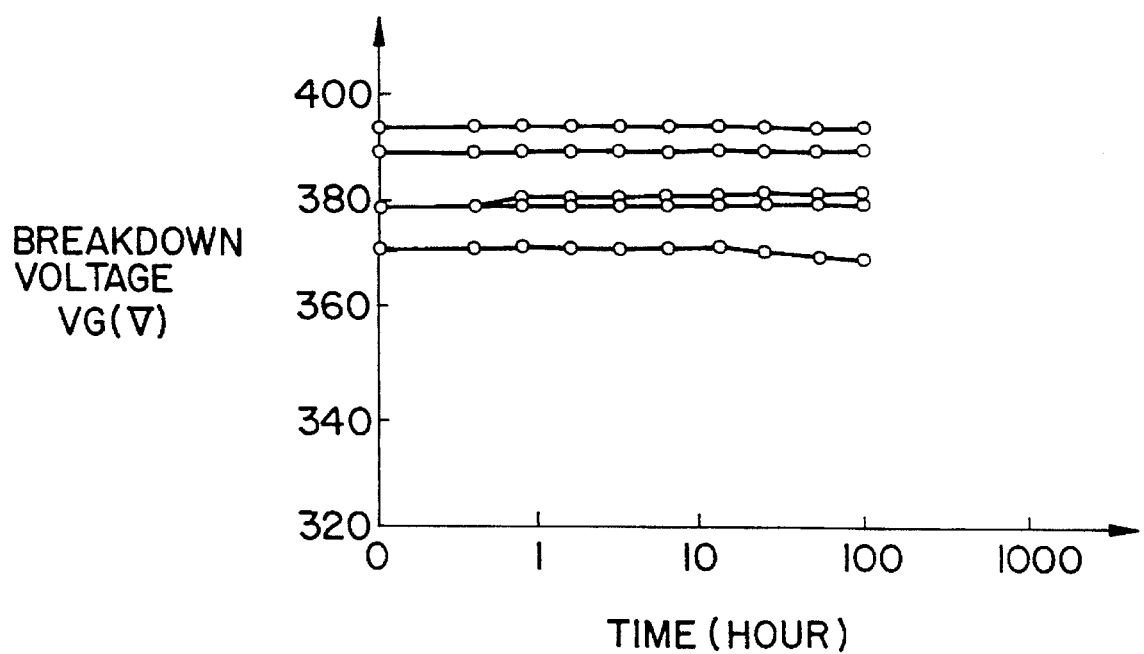

FIG. 3A is a graph for explaining a leakage current I as a function of time when a BT test of the semiconductor device obtained in the above embodiment as a sample is made at a reverse-bias voltage of 300 V and at a high temperature of 170° C. FIG. 3B is a graph for explaining the breakdown voltage $V_Z$ as a function of time when the same test is performed under the same conditions as in FIG. 3A. As may be apparent from the above tests, the leakage current I and the breakdown voltage $V_Z$ are stably maintained without variations.

Figure 4:
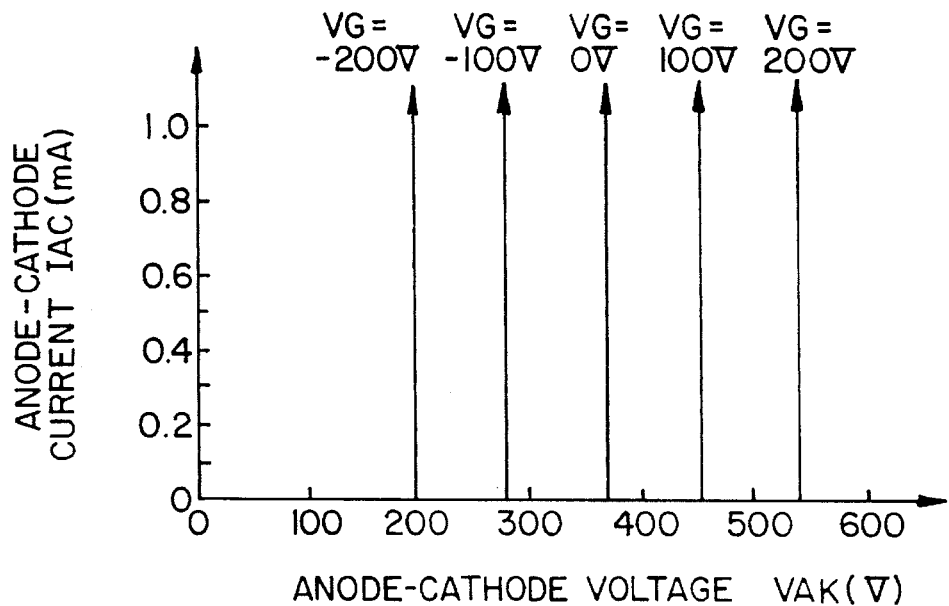
FIG. 4 is a graph showing voltage-current characteristics between the anode and cathode of the protection diode with respect to the gate voltage thereof.

FIG. 4 shows the relationship between a current $I_{AC}$ and a voltage $V_{AC}$ between the anode and the cathode when the gate voltage $V_G$ in an equivalent circuit shown in FIG. 2 is changed using the test sample as described above. The breakdown voltage $V_Z$ is expressed by the following equation:

$$V_Z = aV_{GA} + V_T + (\tfrac{1}{3})V_{BULK}$$

where a: a constant related to the quality of the insulating film and the surface charge density of the semiconductor substrate; in this case, a=0.9; and b: a constant related to the quality and thickness of the insulating film and the surface charge density of the semiconductor substrate; in this case, b=⅓.

Since the breakdown voltage $V_Z$ varies linearly with respect to the voltage $V_{GA}$ between the gate and the anode, the breakdown voltage $V_Z$ can be arbitrarily set by setting the gate voltage.

The diode thus breaks down with a minimum area of the depletion region 18 due to the buffer effect of the inverted layer 17. If the same operation area is given, it is confirmed by experiment that the operation resistance, or Zener diode, can be decreased to between half and one-fifth of that of a diffusion region obtained by diffusing an impurity in the conventional base region, or of that of an impurity-doped region obtained by ion-implanting an impurity in part of the inactive base region.

Figure 5A:
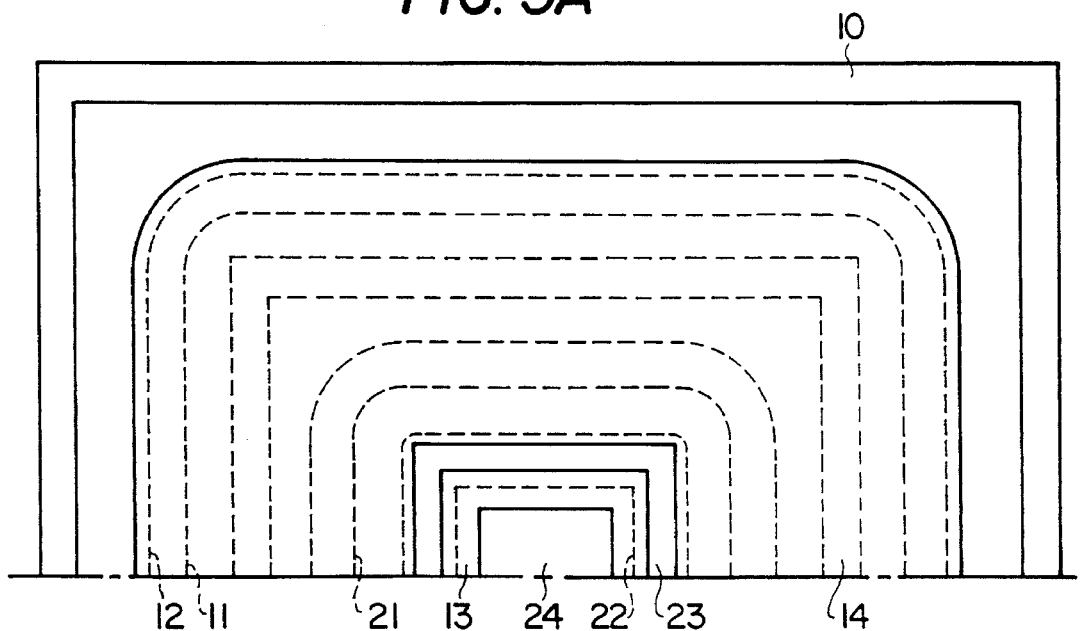
FIG. 5A is a plan view of a semiconductor device including a protection diode of the type described above.
Figure 5B:
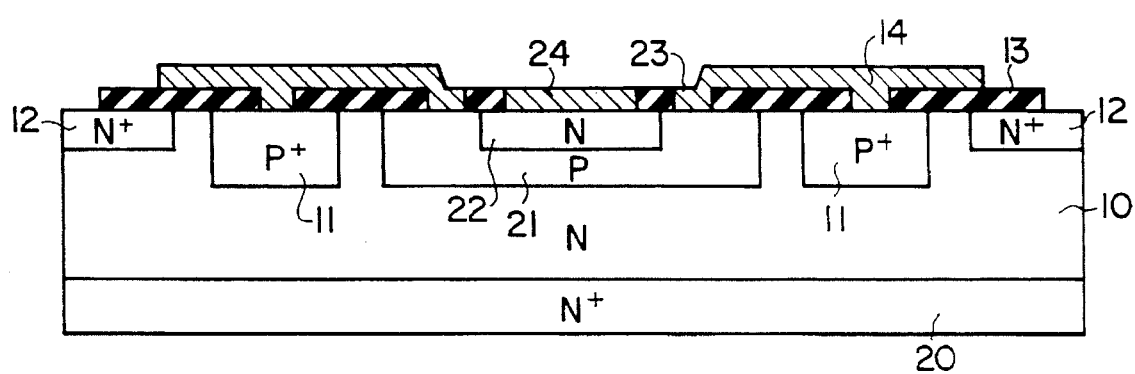
FIG. 5B is a sectional view of the semiconductor device shown in FIG. 5A;.

FIGS. 5A and 5B show a transistor device including a protection diode. A semiconductor substrate 10 has an n-type conductivity and its impurity concentration is $1.4\times 10^{14}$ atoms/cm$^3$. An n$^+$-type diffusion/collector region 20 is formed in the rear surface (the other major surface) of the semiconductor substrate 10. A p-type base region 21 is formed in the front surface (one major surface) of the semiconductor substrate 10. A first region 11 which corresponds to a p-type anode region of the diode is formed to surround the base region 21. The first region 11 is formed to be spaced apart from the base region 21. If parasitic capacitance need not be considered, the inactive region of the base region 21 may be also used as the first region 11.

An n-type emitter region 22 is formed in the base region 21. A second region 12 which has an n-type conductivity is formed together with the emitter region 22 so as to surround the first region 11. The second region 12 serves as the cathode region of the protection diode. The second region 12 is spaced apart from the first region 11 by a predetermined distance. An insulating film 13 which comprises a silicon oxide film is formed on the front surface of the semiconductor substrate 10. A conductive layer 14 is formed on the insulating layer 13 so as to partially overlap the first and second regions 11 and 12. The conductive film 14 is formed by deposition of aluminum together with a base electrode 23 and an emitter electrode 24 and is electrically connected to the first region 11.

Figure 6:
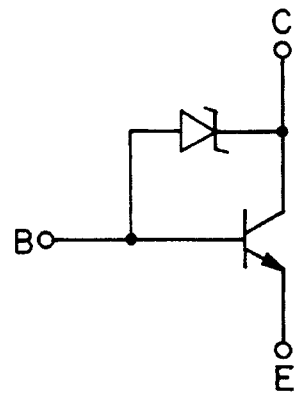
FIG. 6 is a circuit diagram, showing an equivalent circuit of the semiconductor device shown in FIGS. 5A and 5B.

FIG. 6 shows an equivalent circuit of the transistor circuit shown in FIGS. 5A and 5B.

The semiconductor device of the type described above can be manufactured in the same manner as described above even if it has regions (including the semiconductor substrate) which are of opposite conductivity types to those of the regions shown in FIGS. 5A and 5B. In this case, if a p-type semiconductor substrate is used, the diode tends to receive an effect of the positive mobile electric charge in the insulating film 13, as compared with the n-type semiconductor substrate. The anode and cathode regions may comprise buried epitaxial layers, respectively. Furthermore, the anode and cathode regions need not be formed simultaneously with the base and emitter of the transistor.

Figure 7:
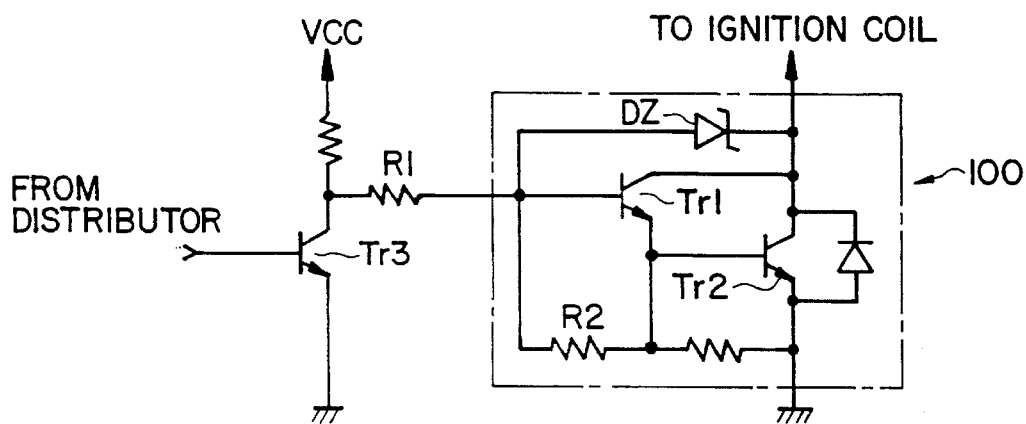
FIGS. 7 and 8 are, respectively, circuit diagrams showing Darlington circuits for ignitor output circuits.

As described above, the transistor circuit of high withstand voltage which includes an overvoltage prevention diode can be effectively used for an ignitor output circuit Of an ignition control circuit of an internal combustion engine. FIG. 7 shows a Darlington circuit 100 which is arranged as an ignitor output circuit of the type described above. The Darlington circuit 100 has a drive transistor Tr1 and an output transistor Tr2 which are Darlington-connected. A protection diode $D_Z$ is connected between the collector and base of the transistor Tr1. A control signal to the transistor Tr1 is produced from the collector of a control transistor Tr3 and is supplied to the base of the transistor Tr1 through a resistor R1.

In the circuit shown in FIG. 7, when the transistor Tr3 is ON, the transistor Tr1 is OFF. A voltage $V_{CB}$ between the collector and base of the transistor Tr1 is increased. When a voltage applied across the protection diode $D_Z$ reaches the breakdown voltage $V_Z$, a current corresponding to the breakdown voltage flows in the base of the transistor Tr1. The voltage $V_{CB}$ stops increasing when the voltage applied to the protection diode $D_Z$ reaches the breakdown voltage. At this time, since the control transistor Tr3 is ON, the breakdown current of the protection diode $D_Z$ flows through the transistor Tr3 if the resistor R1 is not present. In this condition, the transistor Tr1 may not be turned on.

Figure 8:
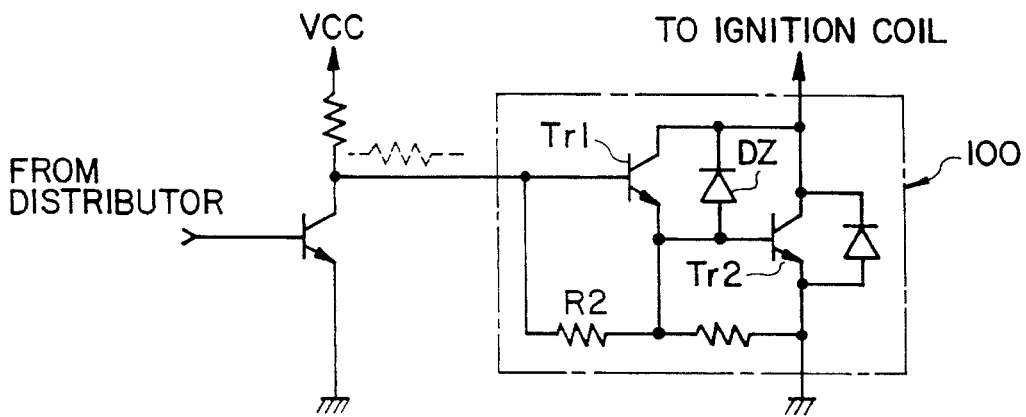

However, as shown in FIG. 8, when a protection diode $D_Z$ is connected between the collector and base of the output transistor Tr2 of a Darlington circuit 100, an internal resistor R2 of the circuit operates in the same manner as the resistor R1 of the circuit shown in FIG. 7. Thus, the resistor of the transistor Tr3 may be omitted. This results in a decrease in the number of component parts externally connected to the circuit. Furthermore, since an input series-connected resistor is not present, gain of the circuit is increased, thus resulting in an advantage in circuit design.

Figure 9A:
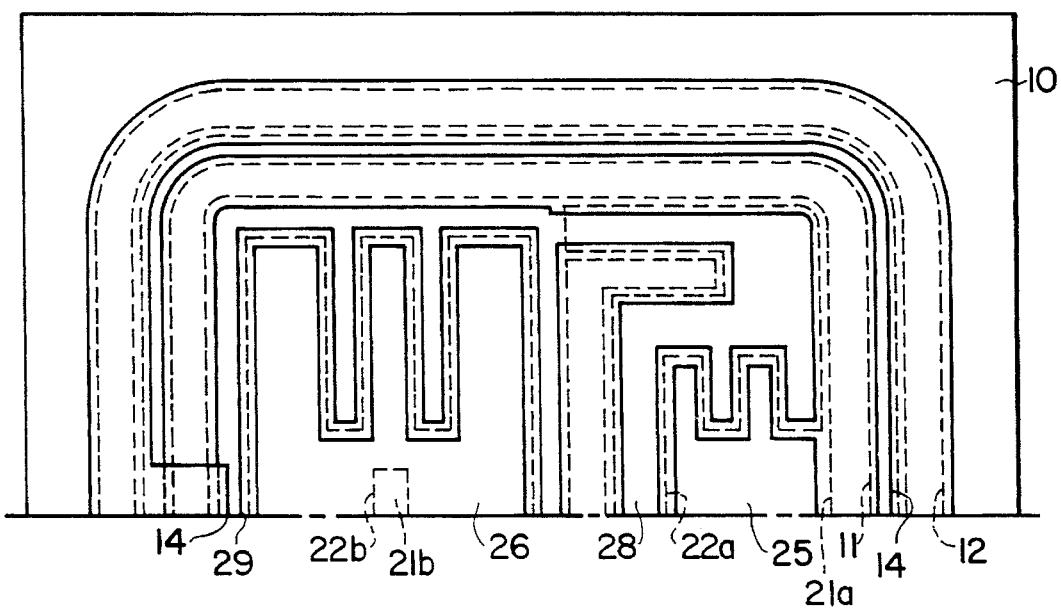
FIG. 9A is a plan view of a semiconductor device including the Darlington circuit shown in FIG. 8.
Figure 9B:
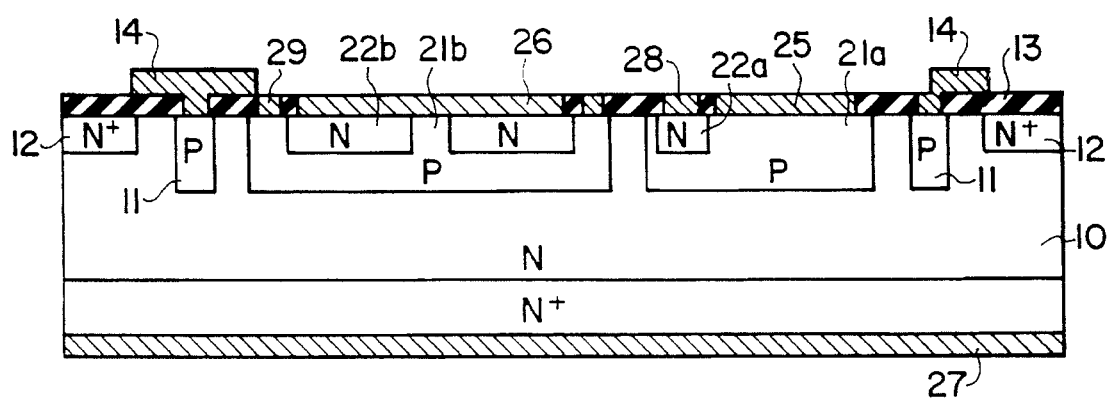
FIG. 9B is a sectional view of the semiconductor device shown in FIG. 9A.

FIGS. 9A and 9B show a semiconductor device having the Darlington circuit 100 shown in FIG. 8. An n-type semiconductor substrate 10 has an impurity concentration of $1\times 10^{14}$ to $2\times 10^{14}$ atoms/cm$^3$. An n$^+$-type diffusion/collector region 20 is formed to cover the entire rear surface (the other major surface) of the semiconductor substrate 10. P-type base regions 21a and 21b of drive and output transistors are formed in the front surface (one major surface) of the semiconductor substrate 10. A first region 11 which has the same conductivity type as that of the base regions 21a and 21b is formed at the same time as the base regions 21a and 21b to surround them. The first region 11 functions as the anode region of the protection diode. The base regions 21a and 21b and the first region 11 which are simultaneously formed are formed by diffusion so as to have a diffusion depth Xj (=30 μm).

An n$^+$-type second region 12 which is spaced apart from the first region 11 is formed to surround the first region 11. The second region 12 serves as the cathode region of the protection diode. The second region 12 is formed simultaneously with n-type emitter regions 22a and 22b. Phosphorus getter sputtering is performed to form an insulating film 13 to a thickness of 4 μm, using mainly silicon oxide (SiO$_2$), on the front surface of the semiconductor substrate 10 including the base regions 21a and 21b and the first and second regions 11 and 12. A conductive film 14 is formed on the insulating film 13 so as to partially overlap both first and second regions 11 and 12. The conductive film 14 is electrically connected to the first region 11 serving as the anode region, and is used as the anode electrode of the protection diode. At the same time, the conductive film 14 serves as a gate electrode of the protection diode by partially overlapping the second region 12 which serves as the cathode region of the protection diode. An aluminum base electrode 25 of the drive transistor, and an emitter electrode 26 and a collector electrode 27 of the output transistor are formed. The conductive film 14 which serves as the anode electrode of the protection diode is commonly connected to an emitter electrode 28 of the drive transistor and a base electrode 29 of the output transistor.

The semiconductor device of the type described above has a Darlington circuit (FIG. 8) which is integrally formed on a single chip. Electrical characteristics of the Darlington transistor device including the protection diode are shown as follows. The withstand voltage of the semiconductor substrate 10 is about 1,000 V, and the withstand voltage between the collector and the emitter of the transistor is 450 V. The breakdown voltage at the base end portion which is surrounded by a guard ring can be more than 600 V by a cancelling effect of electric fields when the depletion region extending from the anode region of the protection diode overlaps the depletion region extending from the transistor. Therefore, this breakdown voltage is sufficiently large to satisfy the conventional requirement of the breakdown operation voltage (340 to 380 V) of the protection diode of the ignitor output circuit.

In the semiconductor device having the configuration described above, the first region 11 which serves as the anode region of the protection diode can be formed simultaneously with the formation of the base regions 21a and 21b of the transistor. Furthermore, the second region 12 which serves as the cathode region can be formed simultaneously with the formation of the emitter regions 22a and 22b of the transistor. A portion of the insulating film 13 which is under the conductive film 14 as the gate electrode of the protection diode may be substituted by a field oxide film used for forming the transistor. The Darlington transistor circuit including the monolithic protection diode can be manufactured during the same process as is used for forming the conventional transistor. Furthermore, even if the protection diode is formed between the collector and the base of the transistor circuit (FIG. 7), the conductive film 14 which is electrically connected to the first region 11 can be connected to the aluminum base electrode 25 of the drive transistor. In this case, the base electrode 29 of the output transistor is isolated from the conductive film 14.

In summary, the Darlington circuit having a protection diode can be manufactured with the same process as is used for forming the transistor. Furthermore, regardless of the presence or absence of the pad portion, the diode can be formed together with the transistor on the same, single chip. Therefore, the number of externally connected components can be eliminated. Even if the protection diode is connected between the collector and the base of the output transistor (the base region of the output transistor does not have a pad portion), the chip size need not be increased.

What we claim is:

1. A semiconductor device having an overvoltage protection function comprising:

a substrate having N-type conductivity with impurity concentration of approximately $1.0 \times 10^{14}$ to $2.0 \times 10^{14}$ atoms/cm$^3$;

a cathode conductive layer formed on a first major surface of said substrate;

a P-type diffusion region formed in the substrate and occupying a first predetermined diffusion depth from a second major surface of said substrate;

an N-type diffusion region formed in the substrate, spaced apart from said P-type diffusion region, and occupying a second predetermined diffusion depth from said second major surface, said N-type diffusion region having an impurity concentration higher than the impurity concentration of said substrate;

an anode conductive layer overlapping at least a portion of said P-type diffusion region for receiving a reverse-bias voltage, said reverse-bias voltage being set not less than 200 v and applied across said cathode conductive layer with respect to said anode conductive layer ($V_{AC}$);

an insulating layer overlapping at least a portion of the second major surface of said substrate between the P-type diffusion region and the N-type diffusion region; and a gate electrode conductive layer overlapping at least a portion of said insulating layer which includes at least said portion of the second major surface of said substrate between the P-type diffusion region and the N-type diffusion region, said gate electrode conductive layer for inputting a constant potential difference set in the range of −200 to 200 v and applied across said gate electrode conductive layer with respect to said anode conductive layer ($V_{GA}$), the reverse-bias voltage ($V_{AC}$) applied across the cathode conductive layer and the anode conductive layer being set greater than the constant potential difference set across the gate electrode conductive layer and the anode conductive layer ($V_{GA}$);

wherein $V_{GA} \neq 0$; and whereby said semiconductor device provides a controlled breakdown voltage in response to a high reverse-bias voltage applied across the cathode conductive layer and the anode conductive layer ($V_{AC}$).

2. A semiconductor device as claimed in claim 1 wherein said gate electrode conductive layer and said anode conductive layer are connected to a voltage setting means E.

3. A semiconductor device as claimed in claim 1 wherein the substrate has an impurity concentration of $1.5 \times 10^{14}$ atoms/cm$^3$.

4. A semiconductor device as claimed in claim 1 wherein the P-type diffusion region has a surface concentration of $1 \times 10^{18}$ atoms/cm$^3$.

5. A semiconductor device as claimed in claim 1 wherein the N-type diffusion region has a surface concentration of $2 \times 10^{19}$ atoms/cm$^3$.

6. A semiconductor device as claimed in claim 1 wherein the first predetermined diffusion depth is 30 μm.

7. A semiconductor device as claimed in claim 1 wherein the second predetermined diffusion depth is 18 μm.

8. A semiconductor device as claimed in claim 1 wherein the insulating film comprises a silicon oxide film (SiO$_2$) formed by phosphorous getter sputtering to a thickness of 4.0 μm.

9. A semiconductor device as claimed in claim 1 wherein the gate electrode conductive material and the anode conductive material respectively comprise aluminum deposition films each having a thickness of 4.0 μm.

10. A semiconductor device as claimed in claim 1 wherein the semiconductor device is used for protecting an output transistor circuit.

11. A semiconductor device as claimed in claim 10 wherein the semiconductor device shares the same substrate with the output transistor circuit.

12. A semiconductor device as claimed in claim 11 wherein the output transistor circuit includes:

a transistor base region formed in the substrate and spaced apart from said P-type diffusion region; and a transistor emitter region formed in said transistor base region, wherein said cathode conductive layer serves as a transistor collector region.

13. A semiconductor device as claimed in claim 11 wherein the output transistor circuit includes:

a transistor base region formed in said P-type diffusion region; and a transistor emitter region formed in said transistor base region, wherein said cathode conductive layer serves as a transistor collector region.

14. A semiconductor device having an overvoltage protection function and including Darlington-connected drive and output transistors, the semiconductor device comprising:

a substrate having N-type conductivity;

a cathode conductive layer formed on a first major surface of said substrate;

a P-type diffusion region formed in the substrate and occupying a first predetermined diffusion depth from a second major surface of said substrate;

an N-type diffusion region formed in the substrate, spaced apart from said P-type diffusion region, and occupying a second predetermined diffusion depth from said second major surface, said N-type diffusion region having an impurity concentration higher than the impurity concentration of said substrate;

an anode conductive layer overlapping at least a portion of said P-type diffusion region for receiving a reverse-bias voltage, said reverse-bias voltage being set not less than 200 v and applied across said cathode conductive layer with respect to said anode conductive layer ($V_{AC}$);

an insulating layer overlapping at least a portion of the second major surface of said substrate between the P-type diffusion region and the N-type diffusion region; and a gate electrode conductive layer overlapping at least a portion of said insulating layer which includes at least said portion of the second major surface of said substrate between the P-type diffusion region and the N-type diffusion region, said gate electrode conductive layer for inputting a constant potential difference set in the range of −200 to 200 v and applied across said gate electrode conductive layer and said anode conductive layer ($V_{GA}$), the reverse-bias voltage ($V_{AC}$) applied across the cathode conductive layer and the anode conductive layer being set greater than the constant potential difference set across the gate electrode conductive layer and the anode conductive layer ($V_{GA}$);

a Darlington drive transistor having a drive transistor P-type base region formed in said substrate, spaced apart from said P-type diffusion region, and a drive transistor N-type emitter region formed within said drive transistor P-type base region, wherein said cathode conductive layer serves as a collector region for the Darlington drive transistor; and a Darlington output transistor having a output transistor P-type base region formed in said substrate, spaced apart from said P-type diffusion region, and an output transistor N-type emitter region formed within said output transistor P-type base region, wherein said cathode conductive layer serves as a collector region for the Darlington output transistor, said anode conductive layer overlaps at least a portion of said Darlington output transistor base region, and the drive transistor emitter region is electrically connected to the output transistor base region;

wherein $V_{GA} \neq 0$; and whereby said semiconductor device provides a controlled breakdown voltage in response to a high reverse-bias voltage applied across the cathode conductive layer and the anode conductive layer ($V_{AC}$).

15. A semiconductor device as claimed in claim 14 wherein the insulating film comprises a silicon oxide film ($SiO_2$) formed by phosphorous getter sputtering to a thickness of 4.0 μm.

16. A semiconductor device as claimed in claim 14 wherein the gate electrode conductive material and the anode conductive material respectively comprise aluminum deposition films each having a thickness of 4.0 μm.

17. A semiconductor device as claimed in claim 14 wherein the output transistor base region and the drive transistor base region are formed by diffusion and have a diffusion depth of 30 μm, respectively.

18. A semiconductor device as claimed in claim 14 wherein the P-type diffusion region surrounds the output transistor and the drive transistor base regions, and the N-type diffusion region surrounds said P-type diffusion region.

19. A semiconductor device as claimed in claim 14 wherein said semiconductor device is used for an ignitor output circuit of an ignition control circuit of an internal combustion engine.

20. A semiconductor device as claimed in claim 14 wherein said gate electrode conductive layer and said anode conductive layer are connected to a voltage setting means E.

21. A semiconductor device as claimed in claim 14 wherein said substrate includes a substrate layer disposed adjacent to said cathode conductive layer and including said first major surface of said substrate, said substrate layer having an N-type conductivity with impurity concentration substantially equivalent to the impurity concentration of said N-type diffusion region.

22. A semiconductor device as claimed in claim 14 wherein the substrate has an impurity concentration of approximately $1.0 \times 10^{14}$ to $2.0 \times 10^{14}$ atoms/cm$^3$.

23. A semiconductor device having an overvoltage protection function comprising:

a substrate having a first type conductivity;

a first conductive layer formed on a first major surface of said substrate;

a first diffusion region formed in the substrate and occupying a first predetermined diffusion depth from a second major surface of said substrate and having a second type conductivity;

a second diffusion region formed in the substrate, spaced apart from said first diffusion region, and occupying a second predetermined diffusion depth from said second major surface, said second diffusion region having said first type conductivity and an impurity concentration higher than the impurity concentration of said substrate;

a second conductive layer overlapping at least a portion of said first diffusion region for receiving a reverse-bias voltage, said reverse-bias voltage being set not less than 200 v and applied across said first conductive layer with respect to said second conductive layer;

an insulating layer overlapping at least a portion of the second major surface of said substrate between the first diffusion region and the second diffusion region; and a gate electrode conductive layer overlapping at least a portion of said insulating layer which includes at least said portion of the second major surface of said substrate between the first diffusion region and the second diffusion region, said gate electrode conductive layer for inputting a constant potential difference set in the range of −200 to 200 v and applied across said gate electrode conductive layer with respect to said second conductive layer, the reverse-bias voltage applied across the first conductive layer and the second conductive layer being set greater than the constant potential difference set across the gate electrode conductive layer and the second conductive layer;

wherein a potential difference between the anode and gate conductive layers is non-zero; and whereby said semiconductor device provides a controlled breakdown voltage in response to a high reverse-bias voltage applied across the first conductive layer and the second conductive layer.

24. A semiconductor device as claimed in claim 23 wherein said gate electrode conductive layer and said second conductive layer are connected to a voltage setting means E.

25. A semiconductor device as claimed in claim 23 wherein the substrate has an impurity concentration of $1.5 \times 10^{14}$ atoms/cm$^3$.

26. A semiconductor device as claimed in claim 23 wherein the semiconductor device is used for protecting an output transistor circuit.

27. A semiconductor device as claimed in claim 26 wherein the semiconductor device shares the same substrate with the output transistor circuit.

28. A semiconductor device as claimed in claim 27 wherein the output transistor circuit includes:

a transistor base region formed in the substrate and spaced apart from said first diffusion region; and a transistor emitter region formed in said transistor base region, wherein said cathode conductive layer serves as a transistor collector region.

29. A semiconductor device as claimed in claim 27 wherein the output transistor circuit includes:

a transistor base region formed in said first diffusion region; and a transistor emitter region formed in said transistor base region, wherein said cathode conductive layer serves as a transistor collector region.

30. A semiconductor device having an overvoltage protection function and including Darlington-connected drive and output transistors, the semiconductor device comprising:

a substrate having a first type conductivity;

a cathode conductive layer formed on a first major surface of said substrate;

a first diffusion region formed in the substrate and occupying a first predetermined diffusion depth from a second major surface of said substrate and having a second type conductivity;

a second diffusion region formed in the substrate, spaced apart from said first diffusion region, and occupying a second predetermined diffusion depth from said second major surface, said second diffusion region having said first type conductivity and an impurity concentration higher than the impurity concentration of said substrate;

a second conductive layer overlapping at least a portion of said first diffusion region for receiving a reverse-bias voltage, said reverse-bias voltage being set not less than 200 v and applied across said first conductive layer with respect to said second conductive layer;

an insulating layer overlapping at least a portion of the second major surface of said substrate between the first diffusion region and the second diffusion region; and a gate electrode conductive layer overlapping at least a portion of said insulating layer which includes at least said portion of the second major surface of said substrate between the first diffusion region and the second diffusion region, said gate electrode conductive layer for inputting a constant potential difference set in the range of −200 to 200 v and applied across said gate electrode conductive layer and said second conductive layer, the reverse-bias voltage applied across the first conductive layer and the second conductive layer being set greater than the constant potential difference set across the gate electrode conductive layer and the second conductive layer;

a Darlington drive transistor having a drive transistor base region formed in said substrate, spaced apart from said first diffusion region, and a drive transistor emitter region formed within said drive transistor base region, wherein said first conductive layer serves as a collector region for the Darlington drive transistor; and a Darlington output transistor having an output transistor base region formed in said substrate, spaced apart from said first diffusion region, and an output transistor emitter region formed within said output transistor base region, wherein said first conductive layer serves as a collector region for the Darlington output transistor, said second conductive layer overlaps at least a portion of said Darlington output transistor base region, and the drive transistor emitter region is electrically connected to the output transistor base region;

wherein a potential difference between the anode and gate conductive layers is non-zero; and whereby said semiconductor device provides a controlled breakdown voltage in response to a high reverse-bias voltage applied across the first conductive layer and the second conductive layer.

31. A semiconductor device as claimed in claim 30 wherein the first diffusion region surrounds the output transistor and the drive transistor base regions, and the second diffusion region surrounds said first diffusion region.

32. A semiconductor device as claimed in claim 30 wherein said semiconductor device is used for an ignitor output circuit of an ignition control circuit of an internal combustion engine.

33. A semiconductor device as claimed in claim 30 wherein said gate electrode conductive layer and said second conductive layer are connected to a voltage setting means E.

34. A semiconductor device as claimed in claim 30 wherein said substrate includes a substrate layer disposed adjacent to said cathode conductive layer and including said first major surface of said substrate, said substrate layer having said first type conductivity with impurity concentration substantially equivalent to the impurity concentration of said second diffusion region.

\* \* \* \* \*